(12) United States Patent
Yu et al.

(10) Patent No.: US 7,965,506 B1
(45) Date of Patent: Jun. 21, 2011

(54) HEAT SINK APPARATUS AND METHOD FOR ALLOWING AIR TO FLOW DIRECTLY TO AN INTEGRATED CIRCUIT PACKAGE THEREUNDER

(75) Inventors: Zhihai Zack Yu, Petaluma, CA (US); Don Le, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 111 days.

(21) Appl. No.: 11/843,324

(22) Filed: Aug. 22, 2007

(51) Int. Cl.
*H05K 7/20* (2006.01)
*F28F 7/00* (2006.01)
*H01L 23/34* (2006.01)

(52) U.S. Cl. ....... 361/697; 361/703; 361/709; 165/80.3; 174/16.3; 257/717; 257/722

(58) Field of Classification Search ............... 361/694, 361/695, 697, 709, 710; 165/80.2, 80, 185; 257/718, 722, E23.08, E23.103; 174/16.1, 174/16.3
See application file for complete search history.

(56) References Cited

U.S. PATENT DOCUMENTS

| | | | | |
|---|---|---|---|---|
| 5,740,014 A * | 4/1998 | Lin | | 361/697 |
| 6,023,413 A * | 2/2000 | Umezawa | | 361/697 |
| 6,301,110 B1 * | 10/2001 | Kodaira | | 361/697 |
| 6,313,993 B1 * | 11/2001 | Hinshaw et al. | | 361/704 |
| 6,407,919 B1 * | 6/2002 | Chou | | 361/697 |
| 6,575,231 B1 * | 6/2003 | Wu | | 165/121 |
| 6,752,204 B2 * | 6/2004 | Dishongh et al. | | 165/185 |
| 6,826,054 B2 * | 11/2004 | Liu | | 361/719 |
| 6,906,921 B2 * | 6/2005 | Searls et al. | | 361/695 |
| 2001/0052647 A1 * | 12/2001 | Plepys et al. | | 257/738 |
| 2003/0048608 A1 * | 3/2003 | Crocker et al. | | 361/697 |
| 2004/0241417 A1 * | 12/2004 | Fischer et al. | | 428/317.9 |
| 2005/0254206 A1 * | 11/2005 | Kamikakoi et al. | | 361/687 |
| 2005/0254208 A1 * | 11/2005 | Belady et al. | | 361/690 |
| 2005/0281000 A1 * | 12/2005 | Chu et al. | | 361/704 |
| 2006/0146499 A1 * | 7/2006 | Reents | | 361/704 |

* cited by examiner

*Primary Examiner* — Zachary M Pape
(74) *Attorney, Agent, or Firm* — Zilka-Kotab, PC

(57) ABSTRACT

A heat sink apparatus and method are provided for allowing air to flow directly to an integrated circuit package thereunder. In use, a heat sink is provided including an upper portion with a plurality of fins, and a lower portion configured for allowing air to flow directly to an integrated circuit package thereunder.

25 Claims, 5 Drawing Sheets

HEAT SINK APPARATUS AND METHOD FOR ALLOWING AIR TO FLOW DIRECTLY TO AN INTEGRATED CIRCUIT PACKAGE THEREUNDER

FIELD OF THE INVENTION

The present invention relates to heat exchangers, and more particularly to heat exchangers for use with integrated circuits.

BACKGROUND

Integrated circuit heat exchangers come in a variety forms and may include fans, heat sinks, liquid-cooled devices, and/or any other device capable of cooling an integrated circuit. One such heat exchanger includes a heat sink including a solid base that is mounted directly above an integrated circuit package with fins extending upwards from the base of the heat sink. In some systems, a fan may be attached to the heat sink to circulate air across the fins.

Further, to facilitate mounting of the base of the heat sink to an associated circuit board, the base is often sized larger than the integrated circuit package. In such case, portions of the base of the heat sink, which extend beyond the periphery of the integrated circuit package, may include holes, or other coupling mechanisms, for allowing the heat sink base to be coupled to the circuit board. Unfortunately, configuring the heat sink base in such manner precludes air from flowing directly upon the integrated circuit package for cooling purposes.

There is thus a need for addressing these and/or other issues associated with the prior art.

SUMMARY

A heat sink apparatus and method are provided for allowing air to flow directly to an integrated circuit package thereunder. In use, a heat sink is provided including an upper portion with a plurality of fins, and a lower portion configured for allowing air to flow directly to an integrated circuit package thereunder.

DETAILED DESCRIPTION

Figure 1:
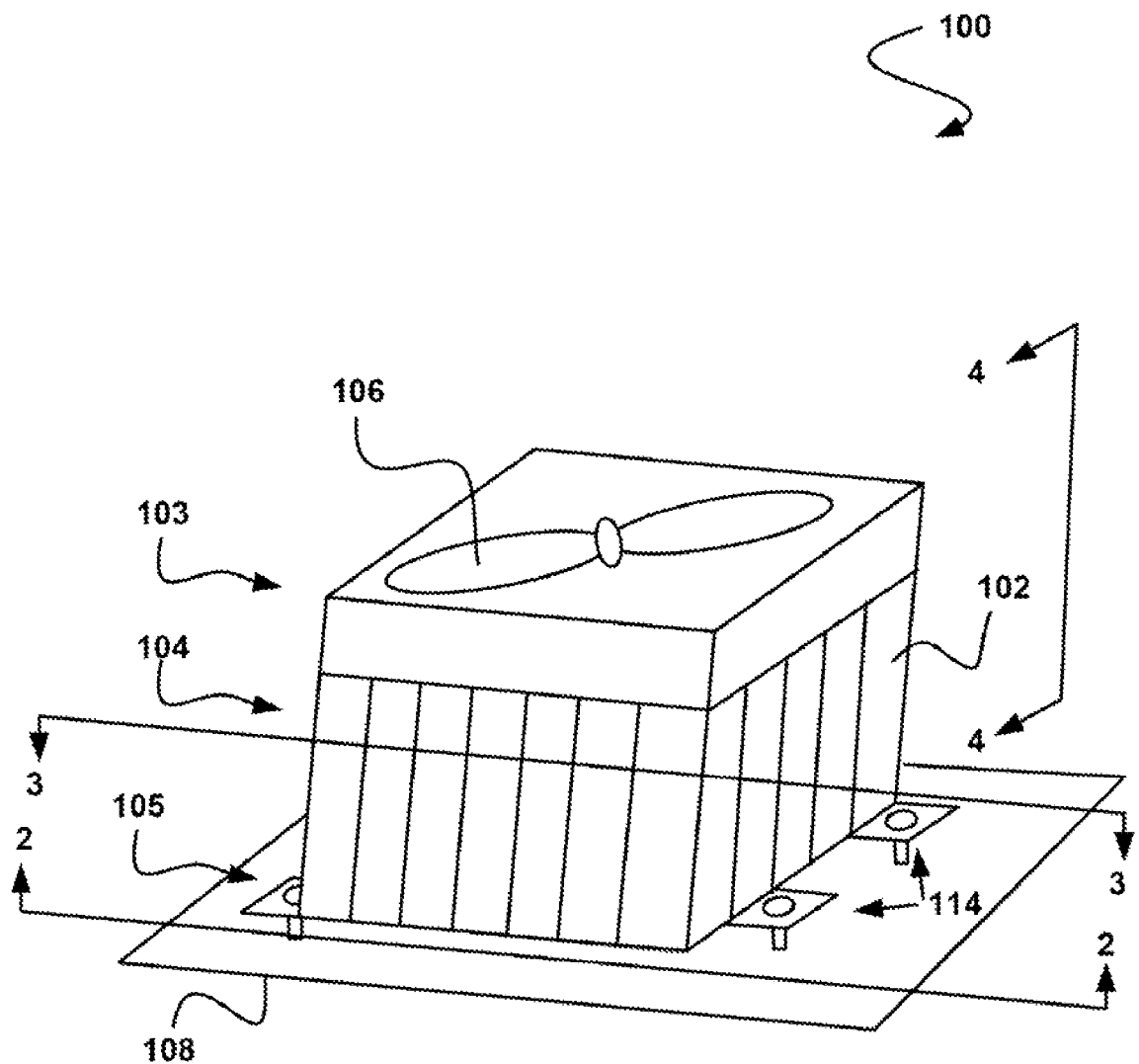
FIG. 1 shows a heat sink apparatus for allowing air to flow directly to an integrated circuit package thereunder, in accordance with one embodiment.

FIG. 1 shows a heat sink apparatus 100 for allowing air to flow directly to an integrated circuit package thereunder (not shown), in accordance with one embodiment. As shown, a heat sink 102 is provided including an upper portion 103 which includes a plurality of fins 104. In the context of the present description, a heat sink, refers to any object that absorbs and/or dissipates heat from another object using thermal contact (i.e. any contact between objects which allows for energy exchange, etc.).

Still yet, in the context of the present description, the fins refer to any protrusion or depression which increases a surface area of the heat sink. For example, in various embodiments, the fins may include, but are not limited to pins, ribs, ledges, grooves, and/or any other protrusion or depression that meets the above definition.

Furthermore, the heat sink 102 includes a lower portion 105 configured for allowing air to flow directly to an integrated circuit package thereunder, as will soon become apparent. Strictly as an option, the integrated circuit package may be a flip chip with an exposed die. In the context of the present description, a flip chip refers to any electronic component or semiconductor device that may be mounted directly onto a substrate, circuit hoard, or carrier without the use of wirebonds.

Furthermore, in the context of the present description, a die refers to any block of material on which a given functional circuit is fabricated. In one embodiment, the block of material may be a semiconducting material. As an option, the integrated circuit package may have a graphics processor attached thereto.

Additionally, the integrated circuit package may be mounted on a circuit board 108, as shown. In one embodiment, the circuit board 108 may include a mother board. In use, the heat sink 102 may be mounted to the circuit board 108 with the integrated circuit package therebetween.

As an option, and as shown in FIG. 1, the heat sink apparatus 100 may further comprise a fan 106 for generating an air flow. In such case, the fan 106 may be coupled to the heat sink 102. In one embodiment, the fan 106 may be coupled to the upper portion 103 of the heat sink 102 for directing the air flow downwardly toward the integrated circuit package.

Of course, the fan 106 is strictly optional. In various embodiments, the heat sink apparatus 100 may be positioned or configured such that the fan 106 is omitted. In this case, the air flow may be generated from other air flow sources in a system encompassing the heat sink apparatus 100 (e.g. a separate fan).

Figure 2:
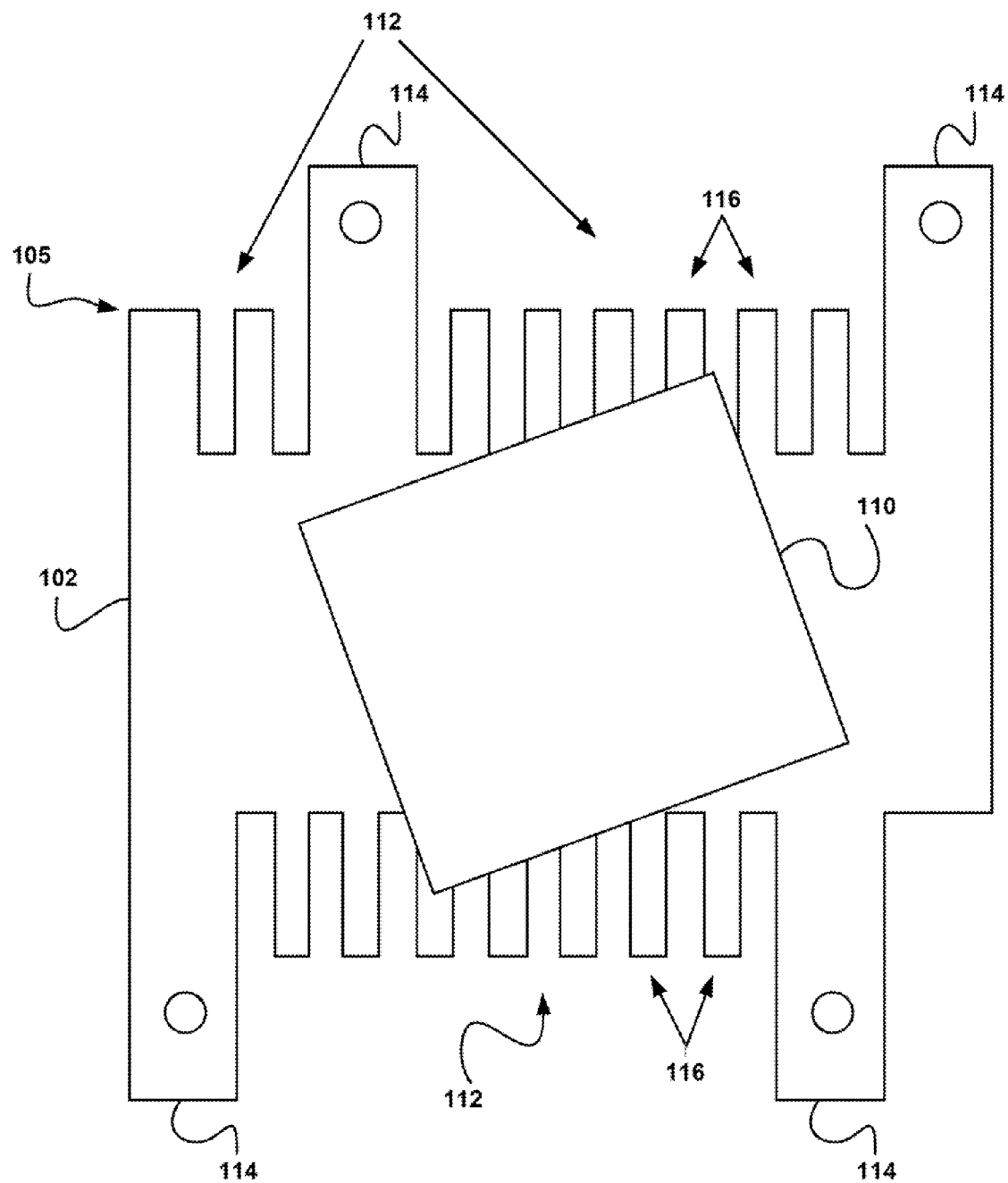
FIG. 2 is a bottom cross-sectional view of the heat sink apparatus of FIG. 1 taken along line 2-2 shown in FIG. 1, in accordance with one embodiment.

FIG. 2 is a bottom cross-sectional view of the heat sink apparatus 100 of FIG. 1 taken along line 2-2 shown in FIG. 1, in accordance with one embodiment. As shown, the lower portion 105 of the heat sink 102 is configured for allowing air to flow directly to an integrated circuit package 110. As an option, and as shown in FIG. 2, the lower portion 105 of the heat sink 102 may include an opening 112 for allowing the air to flow directly to the integrated circuit package 110.

In one embodiment, the opening 112 may be defined by a plurality of extensions 114 that extend from the lower portion 105 of the heat sink 102 for mounting the heat sink 102 to the circuit board 108 (not shown in FIG. 2). In various embodiments, the position of the extensions 114 may vary depending on the heat sink 102, the circuit board 108, the integrated circuit package 110, and/or an orientation or positioning of the same. It should be noted that, although the heat sink 102 is illustrated with four extensions 114, the heat sink 102 may include any number of extensions.

Additionally, in one embodiment, the heat sink 102 may be mounted to the circuit board 108 using a recessed mounting technique, without the use of the extensions 114. In this case, the size and the position of the opening 112 may be independent of the extensions 114.

In another embodiment, the opening 112 may be defined by the fins 104 (not shown in FIG. 2). For example, the opening 112 may be defined by a plurality slits 116 formed in the lower portion 105 of the heat sink 102. As an option, the slits 116 may be formed about a periphery of the lower portion 105 of the heat sink 102. In one embodiment, the periphery of the lower portion 105 of the heat sink 102 may be larger than a periphery of the integrated circuit package 110, as shown.

It should be noted that the periphery of the lower portion 105 of the heat sink 102 may take on various sizes. In one embodiment, the circuit hoard 108 may define the size of the periphery of the lower portion 105 of the heat sink 102. In another embodiment, the integrated circuit package 110 may define the size of the periphery of the lower portion 105 of the heat sink 102. Of course, the size of the periphery of the lower portion 105 of the heat sink 102 may be determined by a variety of factors (e.g. manufacturing factors, packaging factors, etc.).

In any case, the lower portion 105 of the heat sink 102 may be configured for allowing air to flow directly to the integrated circuit, package 110 using a variety of methods. For example, the lower portion 105 of the heat sink 102 may be cut or milled to generate the opening 112. In one embodiment, the heat sink 102 may be configured for allowing air to flow directly to the integrated circuit package 110 using a mold.

Still yet, the slits 116 may be formed in variety of ways. For example, the slits 116 may be formed from a milling or cutting process. In one embodiment, the slits 116 may be formed as part of a process for generating the fins 104. Of course, however, the lower portion 105 of the heat sink 102 may be configured for allowing air to flow directly to the integrated circuit package 110 using a variety of methods and should not be limited to the above examples.

Figure 3:
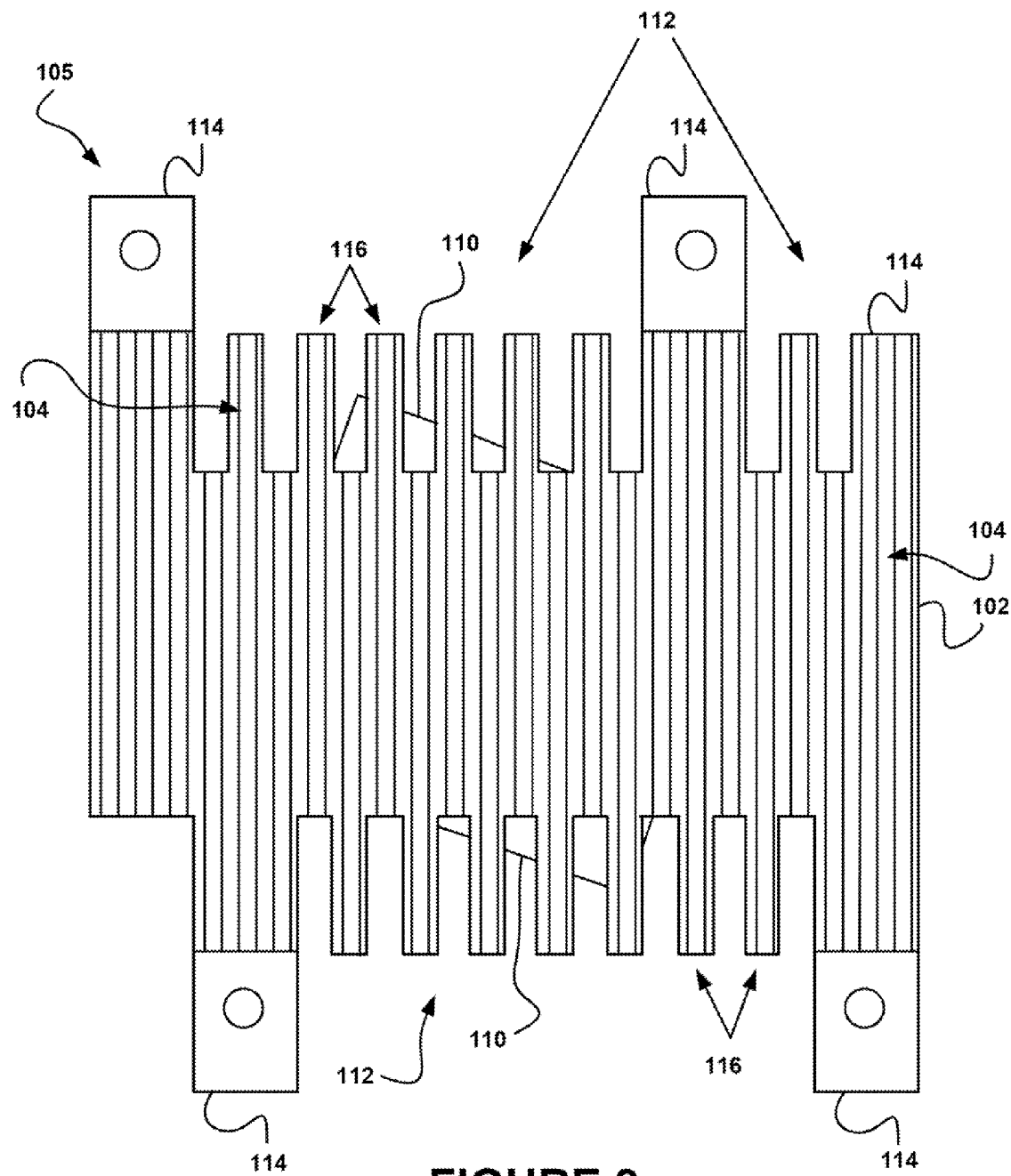
FIG. 3 is a top cross-sectional view of the heat sink apparatus of FIG. 1 taken along line 3-3 shown in FIG. 1, in accordance with one embodiment.

FIG. 3 is a top cross-sectional view of the heat sink apparatus of FIG. 1 taken along line 3-3 shown in FIG. 1, in accordance with one embodiment. As shown, the heat sink 102 is configured such that the integrated circuit package 110 is exposed for allowing air to flow directly to the integrated circuit package 110. As configured, the opening 112 allows air to flow between the fins 104 and through the slits 116 to the integrated circuit package 110. To this end, a top surface of the integrated circuit package 110 is exposed, at least in part.

As an option, a fan (not shown in FIG. 3) may be positioned on the upper portion 103 of the heat sink 102 in order to push, or direct air to the integrated circuit package 110. It should be noted that the opening 112 may take on various sizes. For example, the opening 112 may be configured such that more area of the integrated circuit package 110 is exposed to air flow.

Furthermore, in various embodiments, different criteria may determine the size/depth of the opening 112. In one embodiment, the integrated circuit package 110 may determine the size and/or the depth of the opening 112. In this case, various characteristics of the integrated circuit package 110 may contribute to the determination of the size and/or depth of the opening 112. For example, in various embodiments, such characteristics of the integrated circuit package 110 may include, but are not limited to a size, a type, an operating temperature, a power consumption, a particular use, and/or various other characteristics of the integrated circuit package 110.

Similarly, in various embodiments, a position and a size/depth of the slits 116 may vary depending of various criteria. For example, in one embodiment, the slits 116 may be evenly spaced across the opening 112. In another embodiment, the spacing of the slits 116 may depend on a position and/or orientation of the integrated circuit package 110.

In still another embodiment, the spacing between the slits 116 may depend on the fins 104 on the heat sink 102. For example, the spacing of the fins 104 on the heat sink 102 may correspond to the spacing of the slits 116. Furthermore, the size and/or the depth of the slits 116 may depend on various characteristics of the integrated circuit package 110, the orientation of the integrated circuit package 110, the fins 104 on the heat sink 102, various manufacturing criteria, and/or any other criteria which may influence the size and/or depth of the slits 116.

As shown, the fins 104 may define the slits 116. For example, the slits 116 may be formed about the fins 104. Furthermore, in one embodiment, the fins 104 may be formed on the extensions 114. In any case, the integrated circuit package 110 may be such that operation of the integrated circuit package 110 is more efficient by exposing the integrated circuit package 110 to air flow by providing the opening 112 (thus cooling the same).

Figure 4:
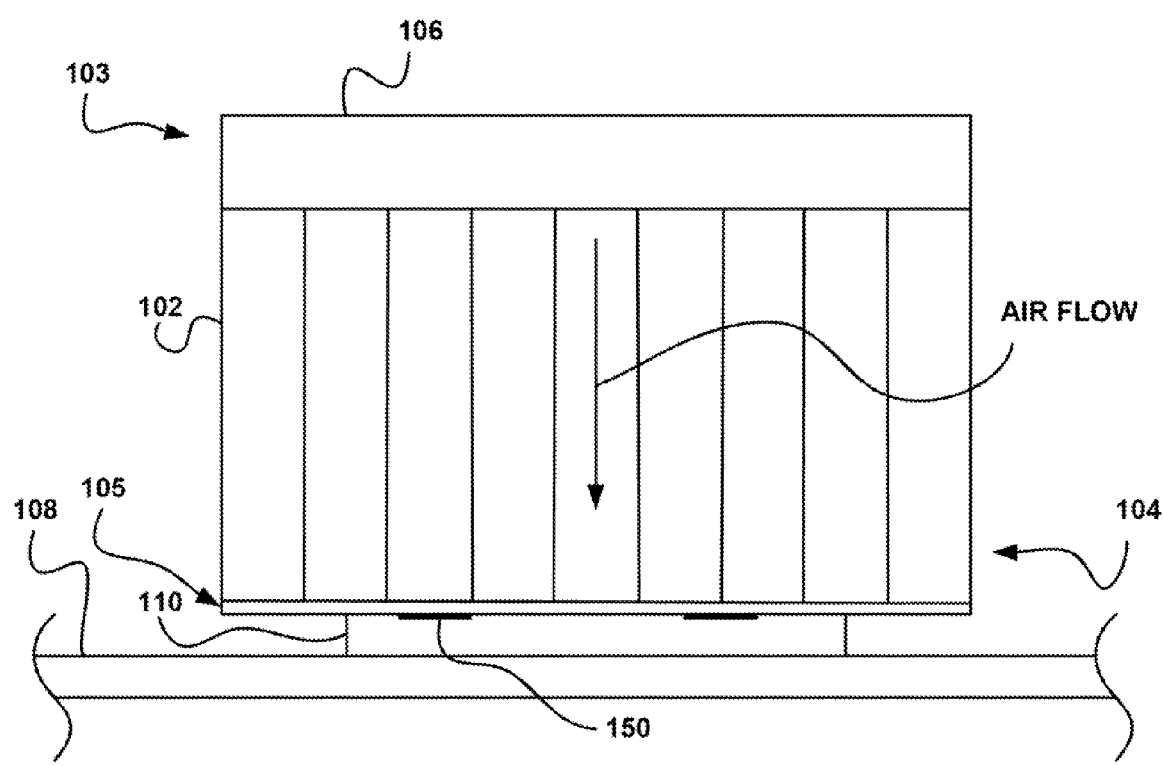
FIG. 4 shows a side view of the heat sink apparatus of FIG. 1, in accordance with one embodiment.

FIG. 4 shows a side view of the heat sink apparatus 100 of FIG. 1, in accordance with one embodiment. As shown, the heat sink 102 is configured such that air may flow directly to the integrated circuit package 110, which, as an option, is positioned on the circuit hoard 108. As another option, the air flow may be directed to the integrated circuit package 110 using the fan 106 positioned on the upper portion 103 of the heat sink 102.

in one embodiment, the air may be allowed to flow directly to the integrated circuit package 110 utilizing an existing air flow. For example, the heat sink 102 may be part of a system such that air flows directly to the integrated circuit package 110 without a fan. In this situation, the tan 106 may be omitted.

In one embodiment, at least one spacer 150 may be positioned between the integrated circuit package 110 and the lower portion 105 of the heat sink 102. In such embodiment, the spacer(s) 150 may be positioned such that air ma be allowed to flow directly to the integrated circuit package 110. In other words, the spacer(s) 150 may be positioned such that the spacer(s) 150 does not necessarily obstruct the direct air flow. As an option, the spacer(s) 150 may be attached to the lower portion 105 of the heat sink 102. This may be accomplished utilizing any desired adhesive or the like.

In one embodiment, the spacer(s) 150 may be formed from an elastomeric material. In the context of the present description, the elastomeric material refers to any material which includes an elastomer. For example, in various embodiments, the material may include vulcanisates, thermosets, thermoplastics, and/or any other material that meets the above definition.

In one embodiment, the spacer(s) 150 may be utilized to provide space between the integrated circuit package 110 and the lower portion 105 of the heat sink 102. It should be noted that the size of the spacer may vary. In various embodiments, the size of the spacer(s) 150 may depend on the integrated circuit package 110, the heat sink 102, and/or various other criteria.

Furthermore, a shape of the spacer(s) 150 may vary. For example, the spacer(s) 150 may be a bead or circular deposition of an elastomer. In some embodiments, the shape of the spacer(s) 150 may allow for lateral air flow across the integrated circuit package 110. Of course, positioning the spacer(s) 150 between the integrated circuit package 110 and the lower portion 105 of the heat sink 102 is purely optional and should not be construed as limiting in any manner.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 5:
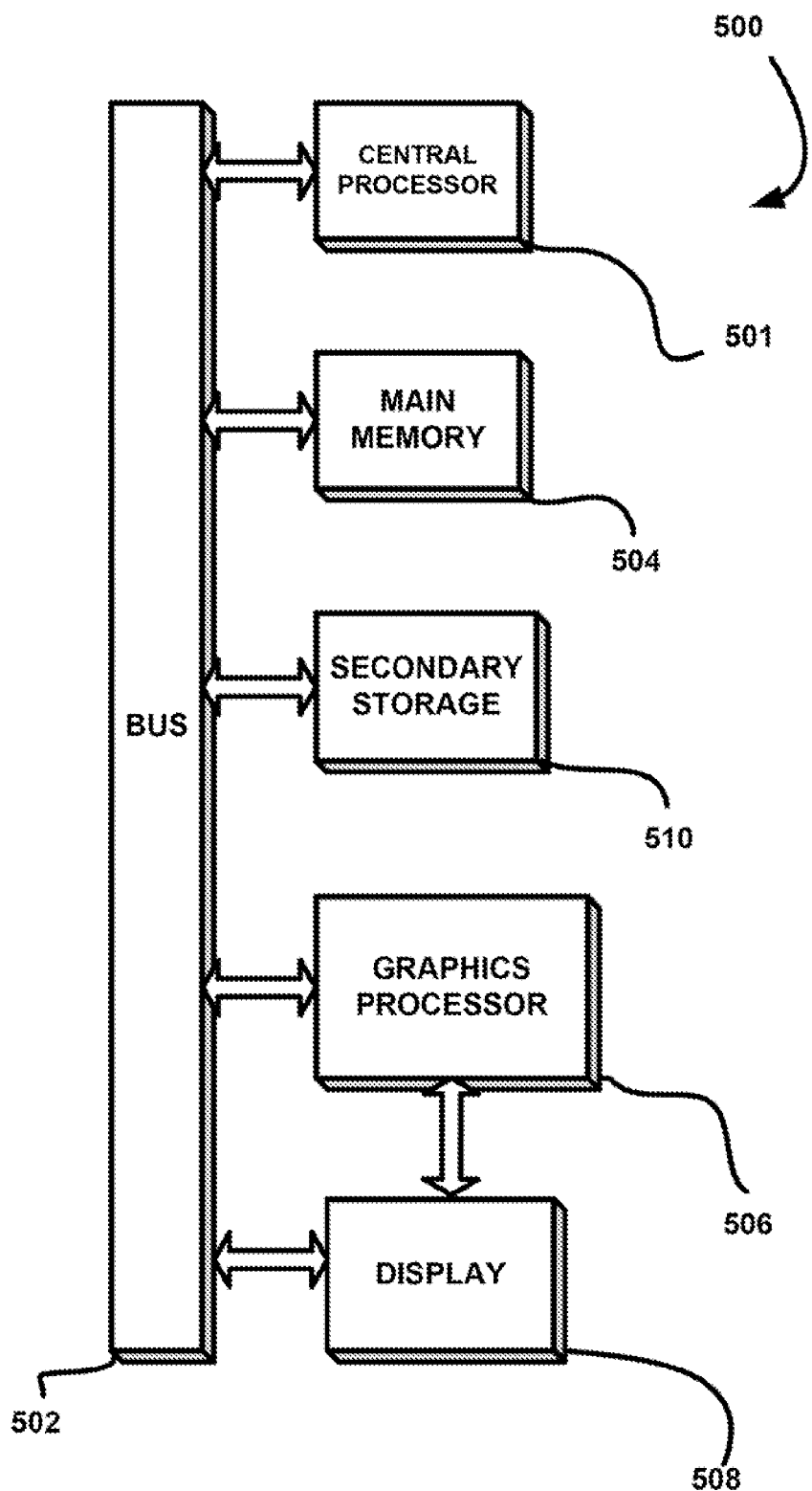
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one host processor 501 which is connected to a communication bus 502. The system 500 also includes a main memory 504. Control logic (software) and data are stored in the main memory 504 which may take the form of random access memory (RAM).

The system 500 also includes a graphics processor 506 and a display 508, i.e. a computer monitor. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 510 includes, for example, a hard disk drive, and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, an integrated circuit (not shown) that is capable of at least a portion of the capabilities of both the host processor 501 and the graphics processor 506, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, lap-top computer, and/or any other type of logic. Still yet, the system 500 may take the form of various other devices m including, but not limited to a personal digital assistant (PDA) device, a mobile phone device, a television, etc.

Further, while not shown, the system 500 may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
 a heat sink directly attached to a circuit board including:
  an upper portion including a plurality of fins, and
  a lower portion configured for allowing air to flow directly to an integrated circuit package thereunder;
 wherein a plurality of spacers positioned between the integrated circuit package and the lower portion of the heat sink are each bead shaped depositions of an elastomer attached to the lower portion of the heat sink, and allow for lateral air flow across the integrated circuit package.

2. The apparatus of claim 1, and further comprising a fan for generating air flow.

3. The apparatus of claim 2, wherein the fan is coupled to the heat sink.

4. The apparatus of claim 3, wherein the fan is coupled to the upper portion of the heat sink for directing the air flow downwardly toward the integrated circuit package.

5. The apparatus of claim 1, wherein the lower portion of the heat sink includes an opening for allowing the air to flow directly to the integrated circuit package thereunder.

6. The apparatus of claim 5, wherein the opening is defined by a plurality of extensions that extend from the lower portion of the heat sink for mounting the heat sink to the circuit board.

7. The apparatus of claim 6, wherein the circuit board includes a mother board.

8. The apparatus of claim 6, wherein the fins are also formed on the extensions.

9. The apparatus of claim 5, wherein the opening is defined by the fins.

10. The apparatus of claim 5, wherein the opening is defined by a plurality slits formed in the lower portion of the heat sink.

11. The apparatus of claim 10, wherein the slits are formed about a periphery of the lower portion of the heat sink.

12. The apparatus of claim 10, wherein a size and a depth of the plurality of slits depend upon characteristics of the integrated circuit package, an orientation of the integrated circuit package, and the plurality of fins of the heat sink.

13. The apparatus of claim 10, wherein a spacing between the plurality of slits of the heat sink depends on the plurality of fins of the heat sink.

14. The apparatus of claim 5, wherein the air flows directly to the integrated circuit package via the opening.

15. The apparatus of claim 5, wherein a size and a depth of the opening is determined by characteristics including a size of the integrated circuit package, a type of the integrated circuit package, an operating temperature of the integrated circuit package, a power consumption of the integrated circuit package, and a particular use of the integrated circuit package.

16. The apparatus of claim 1, wherein a periphery of the lower portion of the heat sink is larger than a periphery of the integrated circuit package.

17. The apparatus of claim 1, wherein the integrated circuit package has a graphics processor attached thereto.

18. The apparatus of claim 1, wherein the integrated circuit package is a flip chip with an exposed die.

19. The apparatus of claim 1, wherein the heat sink is mounted to the circuit board with the integrated circuit package thereunder oriented at a different angle than the heat sink.

20. The apparatus of claim 1, wherein the plurality of spacers are positioned between the integrated circuit package and the lower portion of the heat sink such that the air flows directly to the integrated circuit package thereunder.

21. The apparatus of claim 1, wherein a size of the plurality of spacers depends upon the integrated circuit package and the heat sink.

22. A method, comprising:
mounting a heat sink directly to a circuit board with an integrated circuit package thereon, the heat sink including an upper portion including a plurality of fins, and a lower portion configured for allowing air to flow directly to the integrated circuit package thereunder;
wherein a plurality of spacers positioned between the integrated circuit package and the lower portion of the heat sink are each bead shaped depositions of an elastomer attached to the lower portion of the heat sink, and allow for lateral air flow across the integrated circuit package.

23. A system, comprising:
a circuit board with an integrated circuit package thereon; and
a heat sink directly attached to the circuit board including:
an upper portion including a plurality of fins, and
a lower portion configured for allowing air to flow directly to the integrated circuit package thereunder;
wherein a plurality of spacers positioned between the integrated circuit package and the lower portion of the heat sink are each bead shaped depositions of an elastomer attached to the lower portion of the heat sink, and allow for lateral air flow across the integrated circuit package.

24. The system of claim 23, wherein the circuit board is a component of a computer coupled to a display.

25. The apparatus of claim 13, wherein a spacing of the plurality of fins of the heat sink corresponds to the spacing between the plurality of slits of the heat sink.

* * * * *